(12) United States Patent
Kim et al.

(10) Patent No.: US 10,930,848 B2
(45) Date of Patent: Feb. 23, 2021

(54) VARIABLE RESISTANCE MEMORY DEVICE AND METHOD OF MANUFACTURING THE SAME

(71) Applicant: SAMSUNG ELECTRONICS CO., LTD., Suwon-si (KR)

(72) Inventors: Byongju Kim, Hwaseong-si (KR); Young-Min Ko, Hwaseong-si (KR); Jonguk Kim, Yongin-si (KR); Jaeho Jung, Seoul (KR); Dongsung Choi, Hwaseong-si (KR)

(73) Assignee: SAMSUNG ELECTRONICS CO.. LTD., Suwon-si (KR)

( * ) Notice: Subject to any disclaimer, the term of this patent is extended or adjusted under 35 U.S.C. 154(b) by 0 days.

(21) Appl. No.: 16/415,424

(22) Filed: May 17, 2019

(65) Prior Publication Data

US 2020/0111957 A1   Apr. 9, 2020

(30) Foreign Application Priority Data

Oct. 5, 2018 (KR) .................... 10-2018-0119096

(51) Int. Cl.
*H01L 45/00* (2006.01)
*H01L 21/02* (2006.01)

(52) U.S. Cl.
CPC ........ *H01L 45/1616* (2013.01); *H01L 21/022* (2013.01); *H01L 21/0217* (2013.01); *H01L 21/0228* (2013.01); *H01L 45/06* (2013.01); *H01L 45/126* (2013.01); *H01L 45/1233* (2013.01); *H01L 45/1675* (2013.01)

(58) Field of Classification Search
CPC .......... C23C 16/4554; C23C 16/45542; C23C 16/45527; H01L 21/02274; H01L 21/0228; H01L 21/0217
See application file for complete search history.

(56) References Cited

U.S. PATENT DOCUMENTS

| | | | |
|---|---|---|---|
| 9,397,143 B2 | 7/2016 | Rocklein et al. | |
| 9,484,196 B2 | 11/2016 | Song et al. | |
| 9,601,693 B1 | 3/2017 | Henri et al. | |
| 9,875,891 B2 | 1/2018 | Henri et al. | |
| 2009/0181550 A1* | 7/2009 | Hasebe | C23C 16/45527 438/791 |

(Continued)

FOREIGN PATENT DOCUMENTS

KR   10-2020-0022943 A   3/2020

*Primary Examiner* — Matthew L Reames
*Assistant Examiner* — John A Bodnar
(74) *Attorney, Agent, or Firm* — Sughrue Mion, PLLC

(57) ABSTRACT

A method of manufacturing a variable resistance memory device includes: forming an array of memory cells on a substrate, each memory cell including a variable resistance structure and a switching element; and forming a sidewall insulating layer covering a sidewall of the switching element. The forming the sidewall insulating layer includes: a preliminary step of supplying a silicon source to an exposed sidewall of the switching element; and a main step of performing a process cycle a plurality of times, the process cycle comprising supplying the silicon source and supplying a reaction gas, A time duration of the supplying the silicon source in the preliminary step is longer than a time duration of the supplying the silicon gas in the process cycle in the main step.

17 Claims, 15 Drawing Sheets

(56) References Cited

U.S. PATENT DOCUMENTS

| | | | |
|---|---|---|---|
| 2012/0100722 A1* | 4/2012 | Asai | C23C 16/4408 438/758 |
| 2017/0107614 A1 | 4/2017 | Lee et al. | |
| 2018/0123036 A1* | 5/2018 | Campbell | H01L 45/1675 |
| 2018/0182613 A1 | 6/2018 | Blanquart et al. | |

* cited by examiner

VARIABLE RESISTANCE MEMORY DEVICE AND METHOD OF MANUFACTURING THE SAME

CROSS-REFERENCE TO THE RELATED APPLICATION

This application claims priority from Korean Patent Application No. 10-2018-0119096, filed on Oct. 5, 2018, in the Korean Intellectual Property Office, the disclosure of which is incorporated herein by reference in its entirety.

BACKGROUND

Embodiments of the inventive concepts relate to a semiconductor device and, more particularly, to a variable resistance memory device and a method of manufacturing the same.

Semiconductor devices may be categorized as any one of memory devices and logic devices. The memory devices may store logical data. Generally, semiconductor memory devices may be classified into volatile memory devices and non-volatile memory devices. The volatile memory devices may lose their stored data when their power supplies are interrupted. For example, the volatile memory devices may include dynamic random access memory (DRAM) devices and static random access memory (SRAM) devices. On the contrary, the non-volatile memory devices may retain their stored data even when their power supplies are interrupted. For example, the non-volatile memory devices may include programmable ROM (PROM), erasable PROM (EPROM), electrically EPROM (EEPROM), and a flash memory device.

Next generation semiconductor memory devices such as ferroelectric random access memory (FRAM) devices, magnetic random access memory (MRAM) devices, and phase-change random access memory (PRAM) devices have been developed to provide high-performance and low power consuming semiconductor memory devices. Materials of these next-generation semiconductor memory devices may have resistance values variable according to currents or voltages applied thereto, and may retain their resistance values even when currents or voltages are interrupted.

SUMMARY

Embodiments of the inventive concepts may provide a manufacturing method capable of improving electrical characteristics of a variable resistance memory device and simplifying a process, and a variable resistance memory device manufactured thereby.

According to an aspect of example embodiments, there is provided a method of manufacturing a variable resistance memory device which may include: forming an array of memory cells on a substrate, each memory cell including a variable resistance structure and a switching element; and forming a sidewall insulating layer covering a sidewall of the switching element. The forming the sidewall insulating layer includes: a preliminary step of supplying a silicon source to an exposed sidewall of the switching element; and a main step of performing a process cycle a plurality of times, the process cycle comprising supplying the silicon source and supplying a reaction gas, A time duration of the supplying the silicon source in the preliminary step is longer than a time duration of the supplying the silicon gas in the process cycle in the main step.

According to an aspect of example embodiments, there is provided a method of manufacturing a variable resistance memory device which may include: forming an array of memory cells on a substrate, wherein each of the memory cells comprises a variable resistance structure and a switching element; and forming a sidewall insulating layer covering a sidewall of the switching element. The forming the sidewall insulating layer may include performing a deposition process in which a process cycle comprising supplying a silicon source is performed a plurality of times. A time duration of the supplying the silicon source in an initial process cycle is longer than a time duration of the supplying the silicon source in a subsequent process cycle, when the process cycle is performed the plurality of times.

According to an aspect of example embodiments, there is provided a variable resistance memory device which may include: first conductive lines extending in a first direction; second conductive lines extending in a second direction intersecting the first direction; switching elements provided at positions at which the first conductive lines intersect the second conductive lines; variable resistance structures provided between the switching elements and the first conductive lines; a passivation layer formed on a sidewall of the switching elements; and a main insulating layer formed between the passivation layer and the switching elements. A silicon ratio of the passivation layer may be greater than a silicon ratio of the main insulating layer.

BRIEF DESCRIPTION OF THE DRAWINGS

The inventive concepts will become more apparent in view of the attached drawings and accompanying detailed description of example embodiments.

DETAILED DESCRIPTION OF THE EMBODIMENTS

The embodiments described herebelow are all exemplary, and thus, the inventive concepts are not limited to these embodiments disclosed below, and may be realized in various other forms of embodiment.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1:
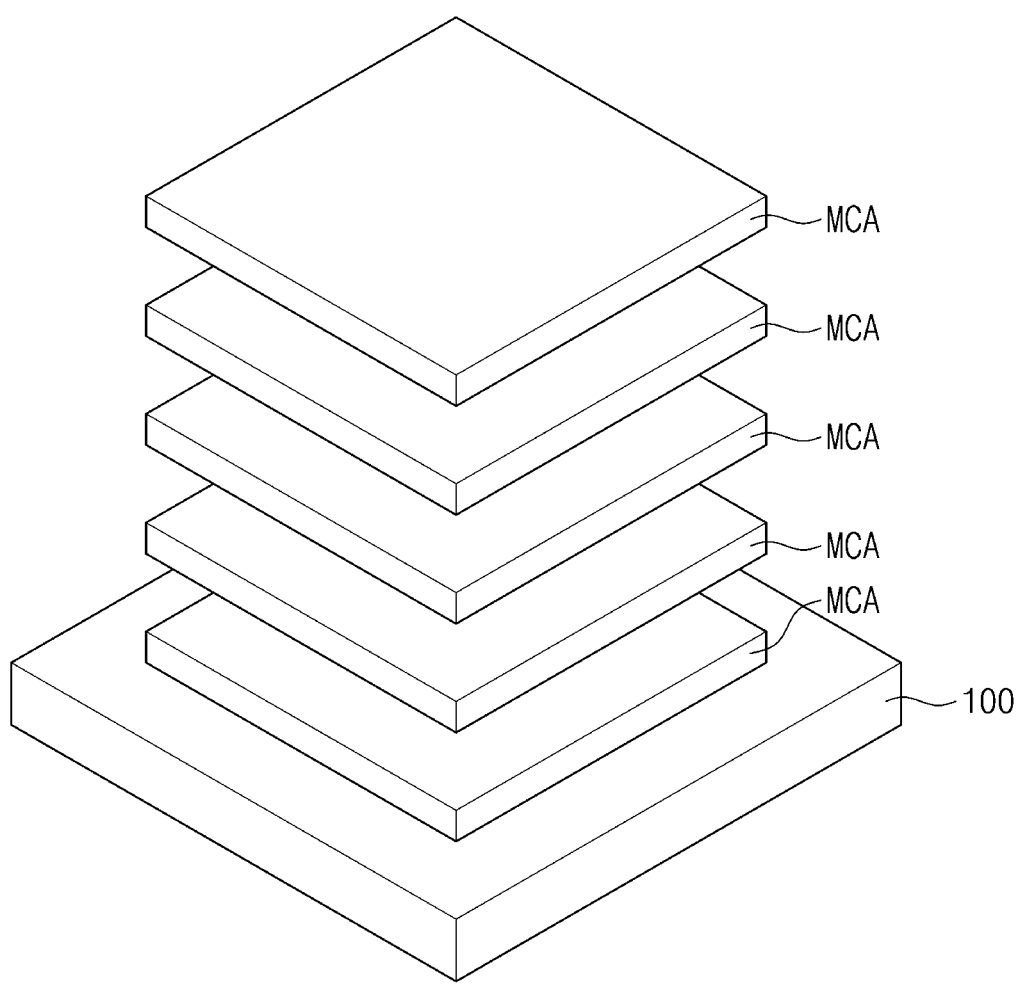
FIG. 1 is a conceptual view illustrating a variable resistance memory device according to some embodiments.

FIG. 1 is a conceptual view illustrating a variable resistance memory device according to some embodiments. Referring to FIG. 1, a variable resistance memory device according to some embodiments may include a plurality of memory cell stacks MCA sequentially stacked on a substrate 100. Each of the memory cell stacks MCA may include a plurality of variable resistance memory cells two-dimensionally arranged. The variable resistance memory device according to some embodiments may include conductive lines which are disposed between the memory cell stacks MCA and are used to write, read and erase the memory cells. FIG. 1 illustrates five memory cell stacks MCA. However, embodiments of the inventive concepts are not limited thereto.

Figure 2:
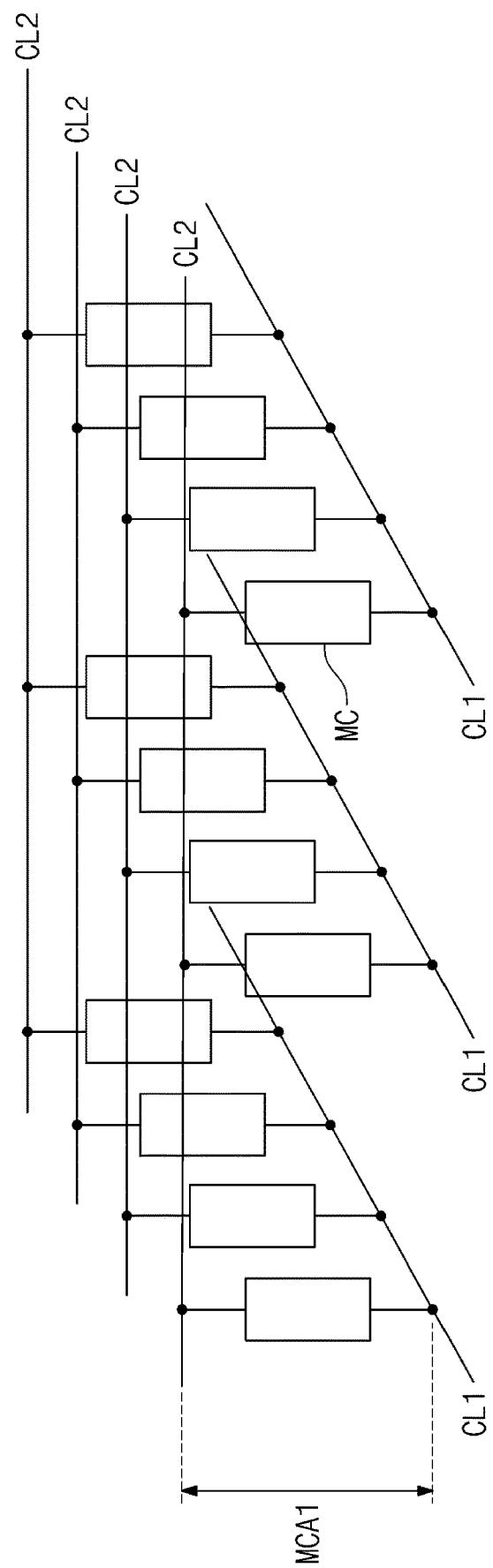
FIG. 2 is a circuit diagram illustrating a memory cell stack of FIG. 1.

FIG. 2 is a circuit diagram illustrating a memory cell stack of FIG. 1. One memory cell stack MCA1 is illustrated in FIG. 2. A first memory cell stack MCA1 may include memory cells MC respectively disposed at intersection points of first conductive lines CL1 and second conductive lines CL2. Even though not shown in FIG. 2, a second memory cell stack may be provided on the first memory cell stack MCA1 Like the first memory cell stack MCA1, the second memory cell stack may include memory cells respectively provided at intersection points of third conductive lines and fourth conductive lines. For example, the third conductive lines may be separate conductive lines vertically spaced apart from the second conductive lines CL2. Alternatively, the second memory cell stack may share the second conductive lines CL2 with the first memory cell stack MCA1. In this case, the third conductive lines may correspond to the second conductive lines CL2.

The memory cells MC of the first memory cell stack MCA1 may be two-dimensionally, but not necessarily, arranged in an array form on the substrate to constitute rows and columns. Each of the memory cells MC may include a switching element and a variable resistance structure. When the first conductive lines CL1 are provided between the substrate and the second conductive lines CL2, the switching element may be provided between the substrate and the variable resistance structure. Alternatively, the variable resistance structure may be provided between the substrate and the switching element. The switching element may be disposed at each of intersection points of the first conductive lines CL1 and the second conductive lines CL2, and may be physically separated from other switching elements disposed at other intersection points adjacent thereto. The variable resistance structure may be disposed at each of the intersection points of the first conductive lines CL1 and the second conductive lines CL2, and may be physically separated from other variable resistance structures disposed at other intersection points adjacent thereto. Alternatively, one variable resistance structure may be shared by a plurality of the memory cells MC. For example, the variable resistance structure may have a line shape which extends in an extending direction of the first conductive lines CL1 or the second conductive lines CL2 when viewed in a plan view.

Figure 3:
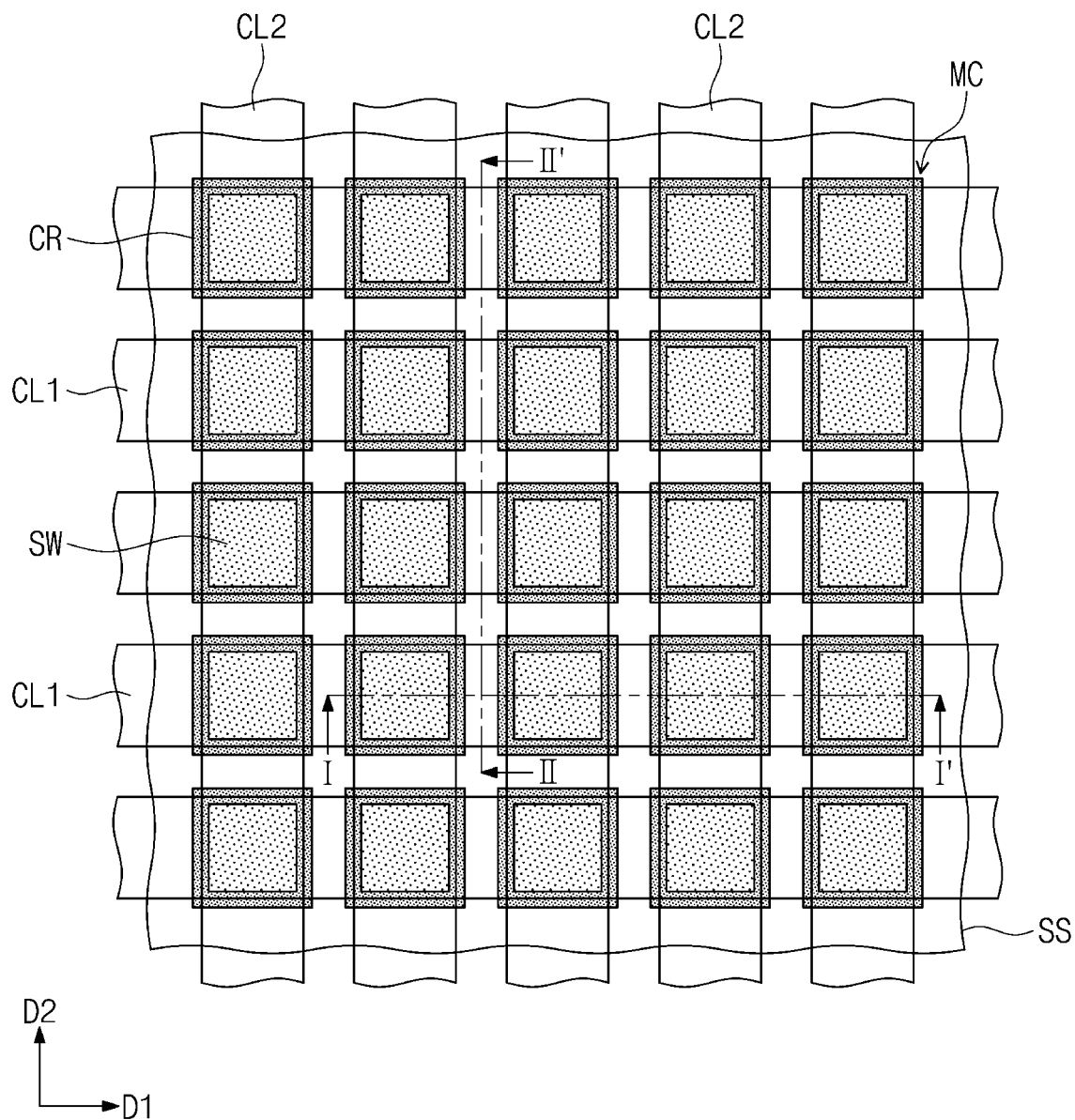
FIG. 3 is a plan view illustrating a variable resistance memory device according to some embodiments.
Figure 4:
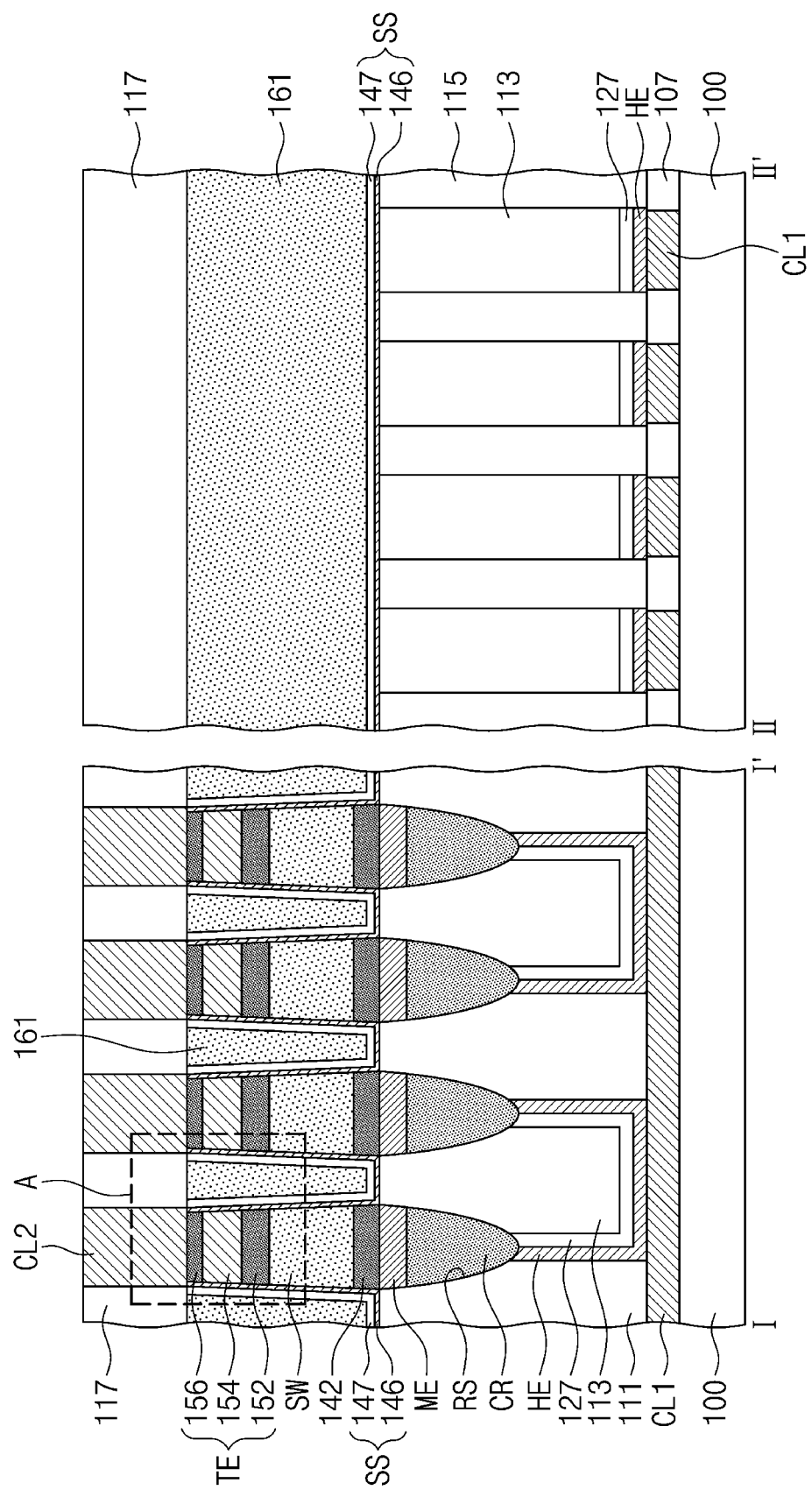
FIG. 4 is a cross-sectional view taken along lines I-I' and II-II' of FIG. 3.
Figure 5:
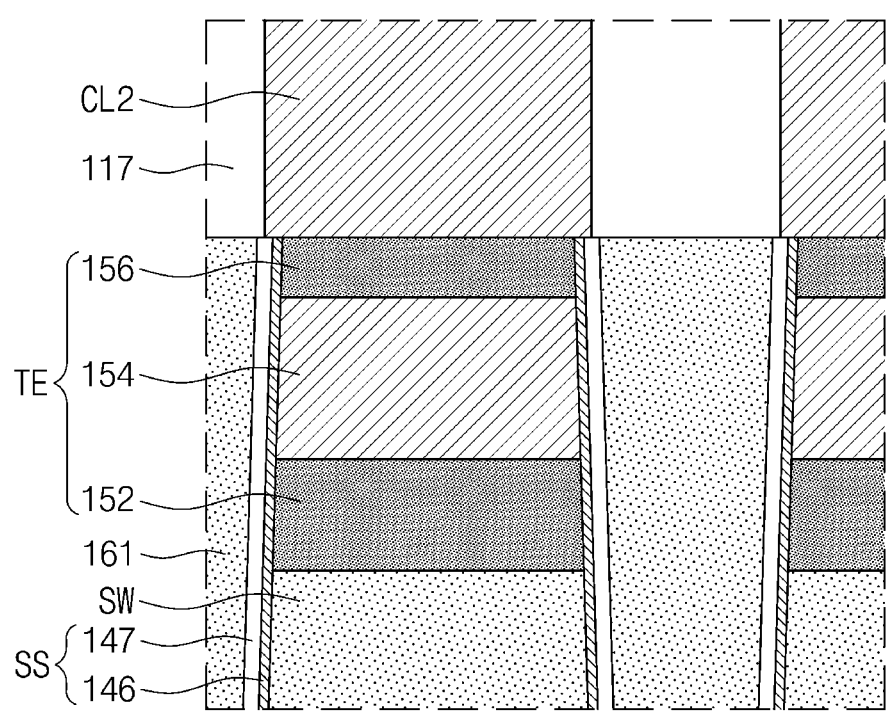
FIGS. 5 to 7 are enlarged views of a region 'A' of FIG. 4.

FIG. 3 is a plan view illustrating a variable resistance memory device according to some embodiments. FIG. 4 is a cross-sectional view taken along lines I-I' and II-II' of FIG. 3. FIG. 5 is an enlarged view of a region 'A' of FIG. 4.

Referring to FIGS. 3 to 5, a memory cell stack may be provided on a substrate 100. For example, the memory cell stack may correspond to one of the memory cell stacks MCA described with reference to FIG. 1. The memory cell stack may be disposed between first conductive lines CL1 and second conductive lines CL2, which are provided on the substrate 100. The second conductive lines CL2 may be provided on the first conductive lines CL1. The first conductive lines CL1 may extend in a first direction D1 substantially parallel to a top surface of the substrate 100, and the second conductive lines CL2 may extend in a second direction D2 which intersects the first direction D1, and may be substantially parallel to the top surface of the substrate 100. The first and second conductive lines CL1 and CL2 may include a conductive material such as copper or aluminum. The first and second conductive lines CL1 and CL2 may further include a conductive metal nitride such as TiN or WN.

Memory cells MC may be disposed at intersection points of the first conductive lines CL1 and the second conductive lines CL2, respectively. Each of the memory cells MC may include a variable resistance structure CR and a switching element SW. Each of the memory cells MC may further include an intermediate electrode ME between the variable resistance structure CR and the switching element SW. The variable resistance structure CR may be provided between the switching element SW and the substrate 100. Alternatively, the switching element SW may be provided between the variable resistance structure CR and the substrate 100. Hereinafter, the embodiment in which the variable resistance structure CR is provided between the first conductive line CL1 and the switching element SW will be described for the purpose of ease and convenience in explanation. However, embodiments of the inventive concepts are not limited thereto.

The first conductive lines CL1 may be provided in a lower interlayer insulating layer 107. The variable resistance structures CR may be provided in recess regions RS formed in first to third interlayer insulating layers 111, 113 and 115 on the first conductive lines CL1. For example, the first to third interlayer insulating layers 111, 113 and 115 may include silicon nitride or silicon oxynitride. The recess regions RS may be respectively disposed at the intersection points of the first conductive lines CL1 and the second conductive lines CL2, and thus, may be two-dimensionally arranged, when viewed in a plan view. Alternatively, the variable resistance structures CR may have line shapes extending in the first direction D1 or the second direction D2.

The variable resistance structures CR may be formed of at least one of materials having properties capable of storing logical data. When the variable resistance memory device according to some embodiments is a phase change memory device, the variable resistance structures CR may include a material of which a phase is reversibly changeable between a crystalline phase and an amorphous phase by a temperature. For example, a phase transition temperature for phase transition between the crystalline phase and the amorphous phase of the variable resistance structures CR may range from about 250 degrees Celsius to about 350 degrees Celsius. The variable resistance structures CR may be formed of a compound that includes at least one of Te and Se (i.e., chalcogenide elements) and at least one of Ge, Sb, Bi, Pb, Sn, Ag, As, S, Si, In, Ti, Ga, P, O, and C. For example, the variable resistance structures CR may include at least one of GeSbTe, GeTeAs, SbTeSe, GeTe, SbTe, SeTeSn, SbSeBi, GeBiTe, GeTeTi, InSe, GaTeSe, and InSbTe. In certain embodiments, the variable resistance structures CR may have a superlattice structure in which layers including Ge and layers not including Ge are repeatedly and alternately stacked. For example, the variable resistance structures CR may have a structure in which GeTe layers and SbTe layers are repeatedly and alternately stacked.

In certain embodiments, the variable resistance structures CR may include at least one of perovskite compounds or at least one of conductive metal oxides. For example, the variable resistance structures CR may include at least one of niobium oxide, titanium oxide, nickel oxide, zirconium oxide, vanadium oxide, (Pr,Ca)MnO$_3$ (PCMO), strontium-titanium oxide, barium-strontium-titanium oxide, strontium-zirconium oxide, barium-zirconium oxide, and barium-strontium-zirconium oxide. When the variable resistance structures CR include a transition metal oxide, a dielectric constant of the variable resistance structures CR may be greater than a dielectric constant of silicon oxide.

Heater electrodes HE may be provided between the first conductive lines CL1 and the variable resistance structures CR. Each of the heater electrodes HE may connect a pair of the variable resistance structures CR, adjacent to each other in the first direction D1, to the first conductive line CL1. For example, each of the heater electrodes HE may include a horizontal portion connected to the first conductive line CL1, and a pair of vertical portions extending from both end portions of the horizontal portion to the pair of variable resistance structures CR, respectively. Alternatively, the heater electrodes HE may be respectively disposed at the intersection points of the first conductive lines CL1 and the second conductive lines CL2, and thus, may be two-dimensionally arranged.

The heater electrodes HE may heat the variable resistance structures CR to change the phases of the variable resistance structures CR. The heater electrodes HE may be formed of a material of which a resistivity is greater than that of the first conductive lines CL1. For example, the heater electrodes HE may include at least one of W, Ti, Al, Cu, C, CN, TiN, TiAlN, TiSiN, TiCN, WN, CoSiN, WSiN, TaN, TaCN, TaSiN, and TiO.

A spacer pattern 127 may be provided between each of the heater electrodes HE and the second interlayer insulating layer 113. The spacer pattern 127 may extend along the horizontal portion and the vertical portions of the heater electrode HE. For example, the spacer pattern 127 may include silicon oxide and/or silicon oxynitride.

Lower portions of the recess regions RS may be occupied by the variable resistance structures CR, and upper portions of the recess regions RS may be occupied by the intermediate electrodes ME. The intermediate electrodes ME may electrically connect the variable resistance structures CR and the switching elements SW, and may prevent the variable resistance structures CR from being in direct contact with the switching elements SW. For example, the intermediate electrodes ME may include at least one of W, Ti, Al, Cu, C, CN, TiN, TiAlN, TiSiN, TiCN, WN, CoSiN, WSiN, TaN, TaCN, and TaSiN. Top surfaces of the first to third interlayer insulating layers 111, 113 and 115 may be substantially coplanar with top surfaces of the intermediate electrodes ME. Alternatively, the intermediate electrodes ME may be provided on the first to third interlayer insulating layers 111, 113 and 115.

Each of the switching elements SW may include an ovonic threshold switch (OTS) element having a bi-directional characteristic. For example, the switching elements SW may be elements based on a threshold switching phenomenon having a nonlinear I-V curve (e.g., a S-shaped I-V curve). The switching elements SW may have a phase transition temperature between a crystalline phase and an amorphous phase, which is higher than that of the variable resistance structures CR. For example, the phase transition temperature of the switching elements SW may range from about 350 degrees Celsius to about 450 degrees Celsius. Thus, when the variable resistance memory device according to the embodiments is operated, the phases of the variable resistance structures CR may be reversibly changed between the crystalline phase and the amorphous phase by an operating voltage (e.g., a program voltage), but the switching elements SW may be maintained in a substantially amorphous state without a phase change even though the operating voltage is applied thereto. In the present specification, the term 'substantially amorphous state' may include an amorphous state, and may also include a case in which a grain boundary or a crystallized portion locally exists in a portion of a component.

The switching elements SW may be formed of a compound that includes at least one of Te and Se (i.e., chalcogenide elements) and at least one of Ge, Sb, Bi, Al, Pb, Sn, Ag, As, S, Si, In, Ti, Ga, and P. The switching elements SW may further include a thermal stabilization element in addition to the compound. The thermal stabilization element may include at least one of C, N, and O. For example, the switching elements SW may include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe.

Bottom carbon electrode patterns 142 may be provided between the switching elements SW and the intermediate electrodes ME. For example, the bottom carbon electrode patterns 142 may include a conductive material including carbon.

Top electrodes TE may be provided between the switching elements SW and the second conductive lines CL2. The top electrodes TE may be disposed on the switching elements SW, respectively, and may be separated from one another. In other words, the top electrodes TE may be two-dimensionally arranged along rows and columns. Alternatively, each of the top electrodes TE may be connected in common to the switching elements SW arranged in the second direction D2.

The second conductive lines CL2 may be provided on the top electrodes TE. The second conductive lines CL2 may be spaced apart from one another in the first direction D1 by a fourth interlayer insulating layer 117. For example, the fourth interlayer insulating layer 117 may include silicon oxide or silicon oxynitride.

A filling insulation layer 161 may be provided to fill a space between the switching elements SW. The filling insulation layer 161 may include silicon nitride. For example, the filling insulation layer 161 may include a $Si_3N_4$ layer. In certain embodiments, the filling insulation layer 161 may include a low-k dielectric layer. For example, the filling insulation layer 161 may include at least one of silicon oxycarbide, silicon oxycarbonitride, and silicon carbonitride. The filling insulation layer 161 may have a grid or mesh shape when viewed in a plan view. A bottom surface of the filling insulation layer 161 may be higher than top surfaces of the variable resistance structures CR.

A sidewall insulating layer SS may be provided between the filling insulation layer 161 and the switching elements SW. The sidewall insulating layer SS may extend under the bottom surface of the filling insulation layer 161. For example, the sidewall insulating layer SS may extend between the filling insulation layer 161 and the first to third interlayer insulating layers 111, 113 and 115. The sidewall insulating layer SS may extend onto sidewalls of the top electrodes TE. For example, a topmost surface of the sidewall insulating layer SS may be substantially coplanar with top surfaces of the top electrodes TE.

The sidewall insulating layer SS may include a main insulating layer 147 between the filling insulation layer 161 and the switching elements SW, and a passivation layer 146 between the main insulating layer 147 and the switching elements SW. The passivation layer 146 may cover the sidewalls of the top electrodes TE. Both the passivation layer 146 and the main insulating layer 147 may include a silicon element and a nitrogen element. The sidewall insulating layer SS may not include oxygen, except undesired impurities. For example, each of the passivation layer 146 and the main insulating layer 147 may include silicon nitride.

The passivation layer 146 may be a silicon-rich layer. In other words, a silicon ratio of the passivation layer 146 may be greater than a silicon ratio of the main insulating layer 147. The silicon ratio used herein means a ratio of silicon atoms. For example, the silicon ratio of the passivation layer 146 may range from about 1.1 times to about 2 times the silicon ratio of the main insulating layer 147. For example, the main insulating layer 147 may include a $Si_3N_4$ layer having a stoichiometric ratio, and the passivation layer 146 may include a $Si_xN_4$ layer where 'x' is greater than 3. When the filling insulation layer 161 includes silicon nitride, the silicon ratio of the passivation layer 146 may be greater than a silicon ratio of the filling insulation layer 161.

The passivation layer 146 may be thinner than the main insulating layer 147. For example, a thickness of the passivation layer 146 may range from about 1/50 to about 1/20 of a thickness of the main insulating layer 147. For example, the thickness of the passivation layer 146 may be about 5 Å. A density of the passivation layer 146 may be lower than a density of the main insulating layer 147. For example, the density of the passivation layer 146 may range from about 70% to about 90% of the density of the main insulating layer 147.

The passivation layer 146 may prevent elements in the switching elements SW from being volatilized by heat generated in manufacturing processes or heat generated in operating the variable resistance memory device after completion of manufacture thereof. In addition, the passivation layer 146 may prevent the elements in the switching elements SW from being combined with hydrogen and/or oxygen to deteriorate electrical characteristics. A nitrogen ratio of the passivation layer 146 may be less than that of the main insulating layer 147, and thus, it is possible to inhibit or prevent the elements in the switching elements SW from being combined with nitrogen atoms to deteriorate electrical characteristics.

Hereinafter, the top electrode TE will be described in more detail.

As illustrated in FIG. 5, the top electrode TE may include a first carbon electrode pattern 152, a metal pattern 154, and a second carbon electrode pattern 156, which are sequentially stacked. The first and second carbon electrode patterns 152 and 156 may include a conductive material including carbon. The metal pattern 154 may include at least one of W, Ti, Al, Cu, C, CN, TiN, TiAlN, TiSiN, TiCN, WN, CoSiN, WSiN, TaN, TaCN, and TaSiN. In some embodiments, the first carbon electrode pattern 152 may be thicker than the second carbon electrode pattern 156.

Figure 6:
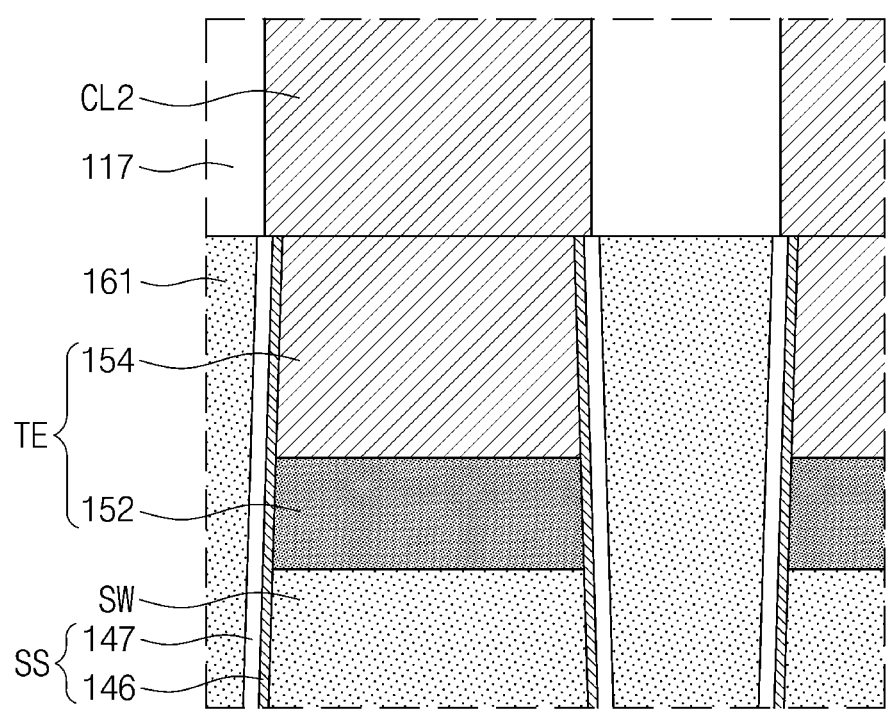
Figure 7:
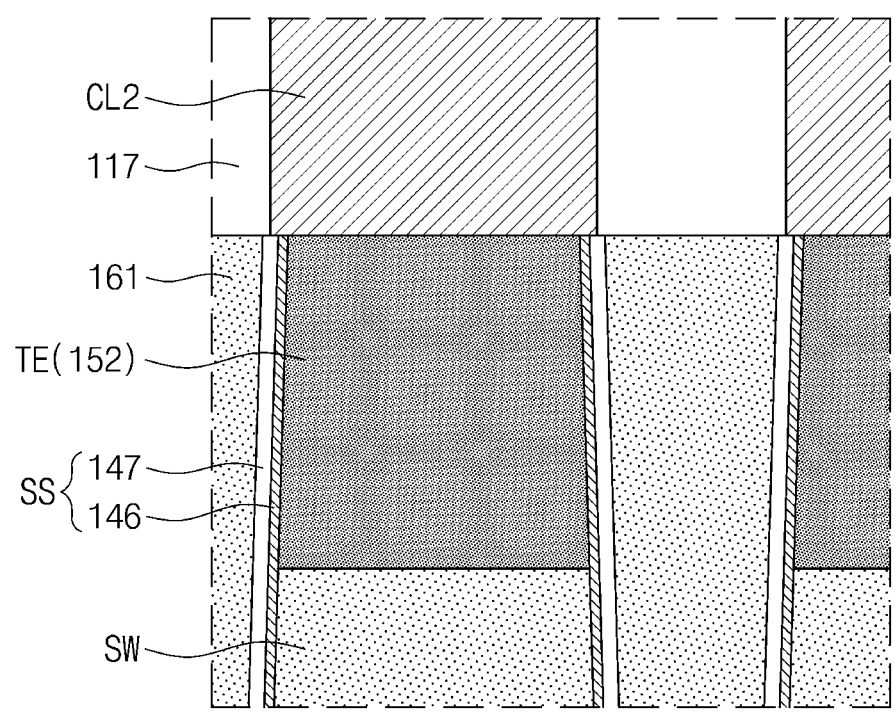

Referring to FIG. 6, the top electrode TE may include a carbon electrode pattern 152 and a metal pattern 154 on the carbon electrode pattern 152. In the present embodiment, the second carbon electrode pattern may not be provided. The metal pattern 154 may be in contact with the second conductive line CL2. Referring to FIG. 7, the top electrode TE may include a carbon electrode pattern 152. A top surface of the carbon electrode pattern 152 may be in contact with the second conductive line CL2. A bottom surface of the carbon electrode pattern 152 may be in contact with the top surface of the switching element SW.

FIGS. 8 to 12 are cross-sectional views taken along the lines I-I' and II-II' of FIG. 3 to illustrate a method of manufacturing a variable resistance memory device, according to some embodiments.

Figure 8:
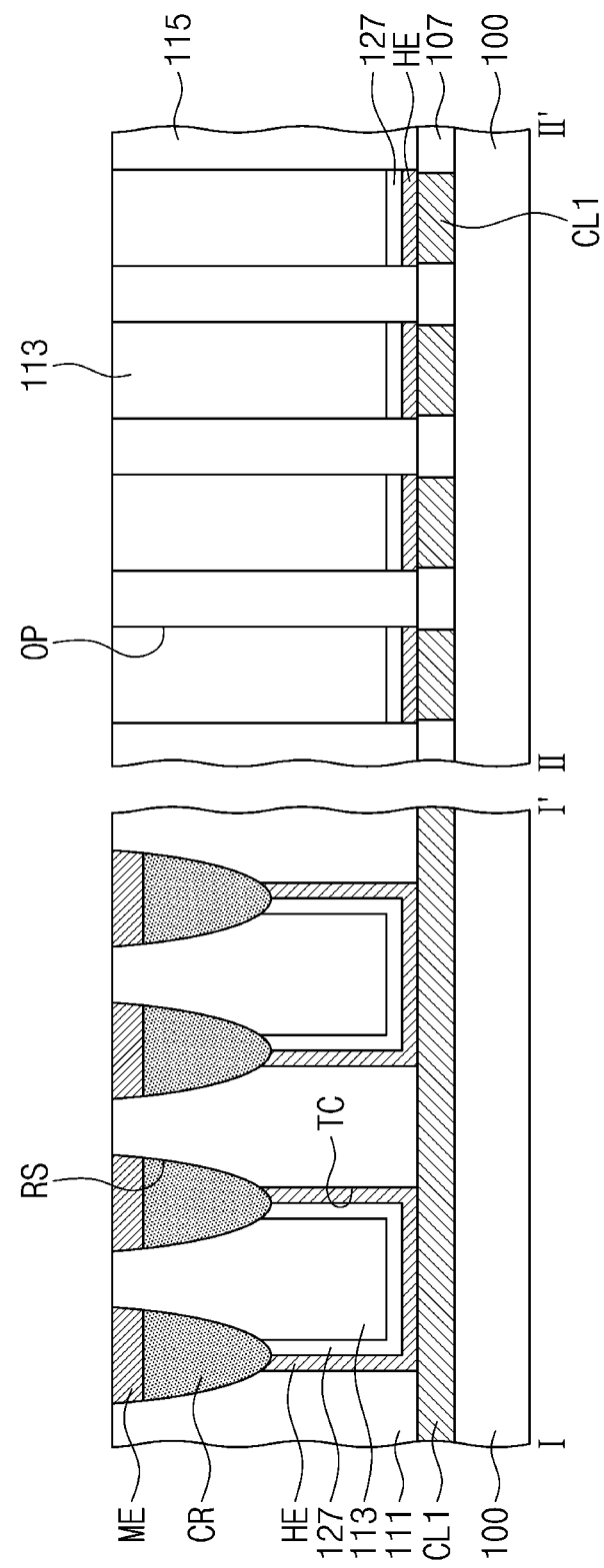
FIGS. 8 to 12 are cross-sectional views taken along the lines I-I' and II-II' of FIG. 3 to illustrate a method of manufacturing a variable resistance memory device, according to some embodiments.

Referring to FIGS. 3 and 8, first conductive lines CL1 may be provided on a substrate 100. The first conductive lines CL1 may be provided in a lower interlayer insulating layer 107. A first interlayer insulating layer 111 may be formed on the first conductive lines CL1, and then, trenches TC extending in the second direction D2 may be formed in the first interlayer insulating layer 111. Each of the trenches TC may intersect the first conductive lines CL1. For example, the first interlayer insulating layer 111 may be formed of silicon nitride or silicon oxynitride.

Heater electrodes HE and spacer patterns 127 may be formed in the first interlayer insulating layer 111 having the trenches TC. For example, the formation of the heater electrodes HE and the spacer patterns 127 may include conformally forming an electrode layer and a spacer layer along shapes (or profiles) of the trenches TC, and patterning the spacer layer, the electrode layer and the first interlayer insulating layer 111 to form opening regions OP intersecting the trenches TC. For example, the electrode layer may include at least one of W, Ti, Al, Cu, C, CN, TiN, TiAlN, TiSiN, TiCN, WN, CoSiN, WSiN, TaN, TaCN, TaSiN, and TiO. The spacer layer may include silicon oxide and/or silicon oxynitride. Before the formation of the opening regions OP, a second interlayer insulating layer 113 filling the trenches TC may be formed on the spacer layer. For example, the second interlayer insulating layer 113 may be formed of the same material as the first interlayer insulating layer 111. Thereafter, a third interlayer insulating layer 115 may be formed to fill the opening regions OP. The formation of the third interlayer insulating layer 115 may include performing a planarization process. For example, the third interlayer insulating layer 115 may be formed of the same material as the first interlayer insulating layer 111.

Recess regions RS may be formed to expose the heater electrodes HE. The formation of the recess regions RS may include etching upper portions of the spacer patterns 127 and etching upper portions of the heater electrodes HE. The spacer patterns 127 and the heater electrodes HE may be etched by a wet etching process. Thereafter, an isotropic wet etching process may be performed to expand empty spaces formed by etching the upper portions of the heater electrodes HE and the upper portions of the spacer patterns 127. For example, the isotropic wet etching process may be performed using an etchant including phosphoric acid.

A variable resistance structure CR and an intermediate electrode ME may be sequentially formed in each of the recess regions RS. In some embodiments, a variable resistance layer may be formed to fill the recess regions RS, and then, an upper portion of the variable resistance layer may be etched to form the variable resistance structures CR. For example, the variable resistance layer may include at least one of GeSbTe, GeTeAs, SbTeSe, GeTe, SbTe, SeTeSn, GeTeSe, SbSeBi, GeBiTe, GeTeTi, InSe, and InSbTe. The variable resistance layer may be formed by a physical vapor deposition (PVD) method or a chemical vapor deposition (CVD) method.

The intermediate electrodes ME may be formed in upper portions of the recess regions RS. In some embodiments, an electrode layer may be formed on the resultant structure having the variable resistance structures CR, and then, a planarization process may be performed on the electrode layer to form the intermediate electrodes ME. Alternatively, the process of forming the intermediate electrodes ME may be omitted. For example, the intermediate electrodes ME may include at least one of W, Ti, Al, Cu, C, CN, TiN, TiAlN, TiSiN, TiCN, WN, CoSiN, WSiN, TaN, TaCN, and TaSiN.

Figure 9:
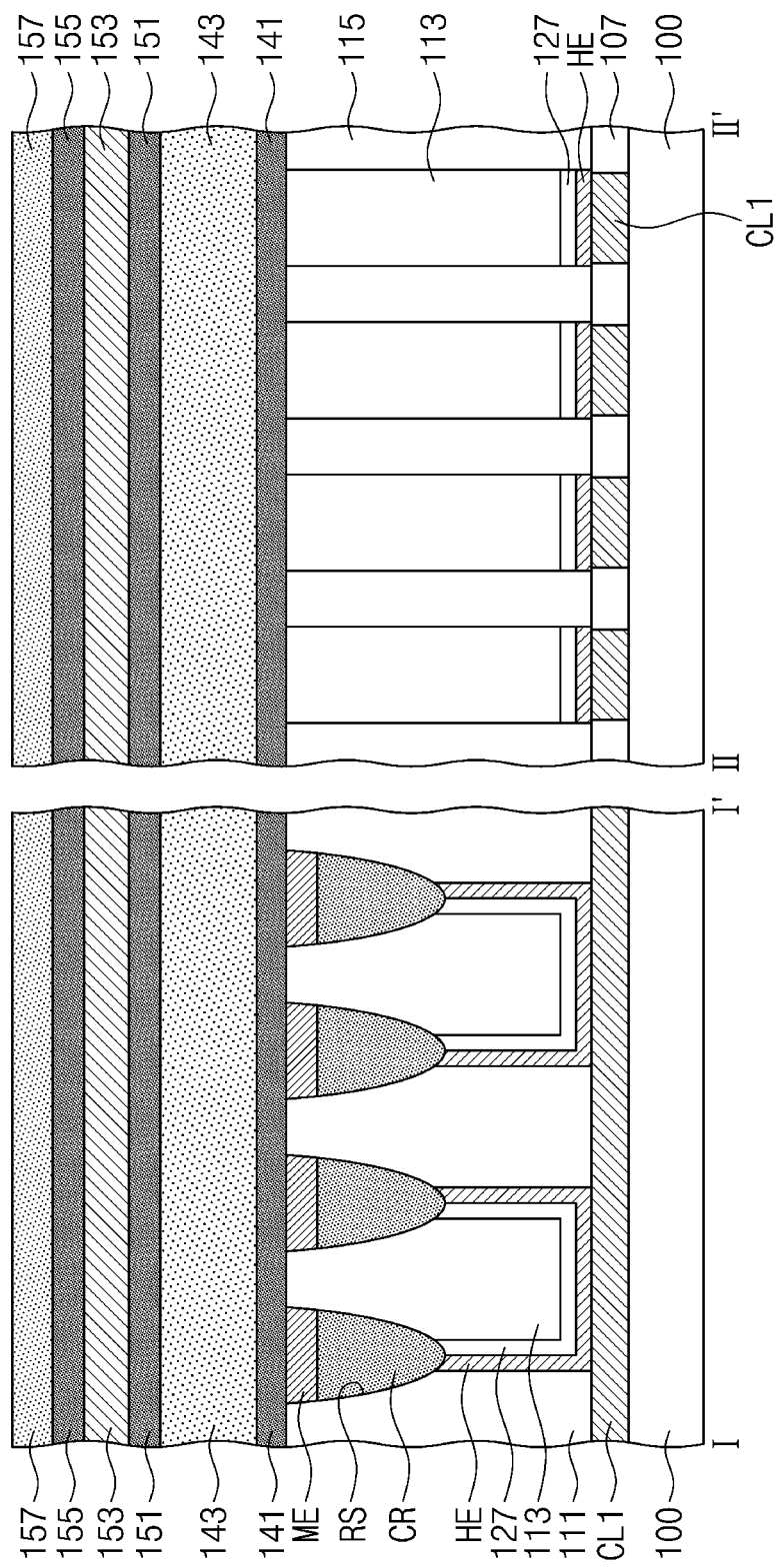

Referring to FIGS. 3 and 9, a bottom carbon electrode layer 141, a switching layer 143, and a top electrode layer 151, 153 and 155 may be sequentially formed on the resultant structure having the intermediate electrodes ME. A mask layer 157 may be formed on the top electrode layer 151, 153 and 155. The top electrode layer 151, 153 and 155 may include a first carbon electrode layer 151, a metal layer 153, and a second carbon electrode layer 155. The first and second carbon electrode layers 151 and 155 may be formed of a conductive material including carbon. The metal layer 153 may be formed of at least one of W, Ti, Al, Cu, C, CN, TiN, TiAlN, TiSiN, TiCN, WN, CoSiN, WSiN, TaN, TaCN, and TaSiN. Alternatively, the metal layer 153 and/or one of the first and second carbon electrode layers 151 and 155 may be omitted as described with reference to FIG. 6 or 7. For example, the switching layer 143 may be formed of a compound that includes at least one of Te and Se (i.e., chalcogenide elements) and at least one of Ge, Sb, Bi, Al, Pb, Sn, Ag, As, S, Si, In, Ti, Ga, and P. The switching layer 143 may further include a thermal stabilization element in addition to the compound.

Figure 10:
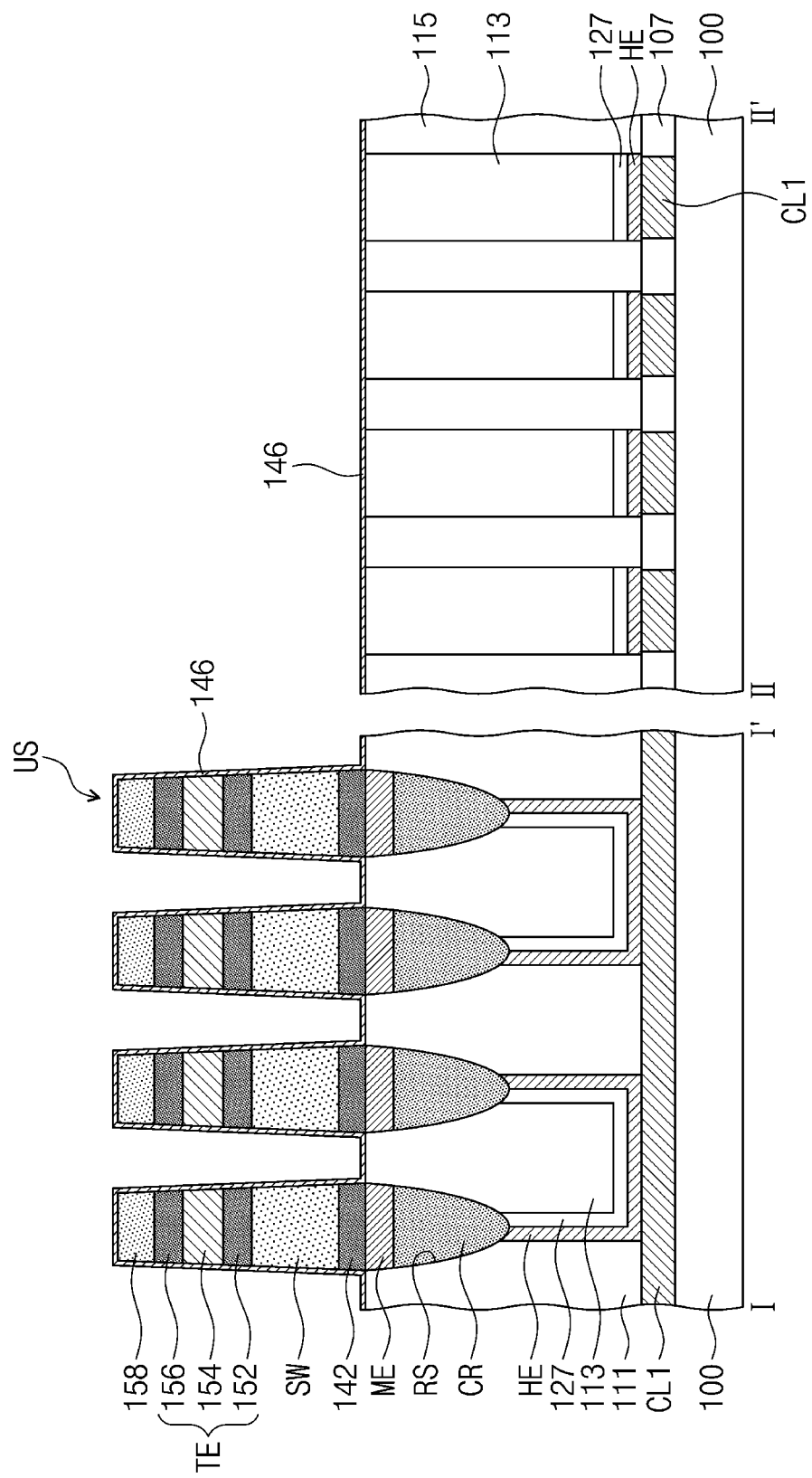

Referring to FIGS. 3 and 10, mask patterns 158 may be formed from the mask layer 157, and then, the top electrode layer 151, 153 and 155, the switching layer 143, and the bottom carbon electrode layer 141 may be sequentially etched using the mask patterns 158 as etch masks. As a result, upper structures US, each of which includes a bottom carbon electrode pattern 142, a switching element SW, and a top electrode TE, may be formed. The top electrode TE may include a first carbon electrode pattern 152, a metal pattern 154, and a second carbon electrode pattern 156. The upper structures US may be spaced apart from one another in the first direction D1, and the second direction D2 and may be two-dimensionally arranged.

A passivation layer 146 may be formed to cover the upper structures US. The passivation layer 146 may cover sidewalls of the switching elements SW. For example, the passivation layer 146 may be in direct contact with the sidewalls of the switching elements SW. The passivation layer 146 may be conformally formed along sidewalls and top surfaces of the upper structures US. For example, the passivation layer 146 may cover sidewalls of the top electrodes TE. The passivation layer 146 may cover top surfaces of the first to third interlayer insulating layers 111, 113 and 115, which are exposed between the upper structures US. The passivation layer 146 may be a silicon-rich layer. A method of forming the passivation layer 146 will be described later in more detail with reference to FIGS. 13 and 14.

Figure 11:
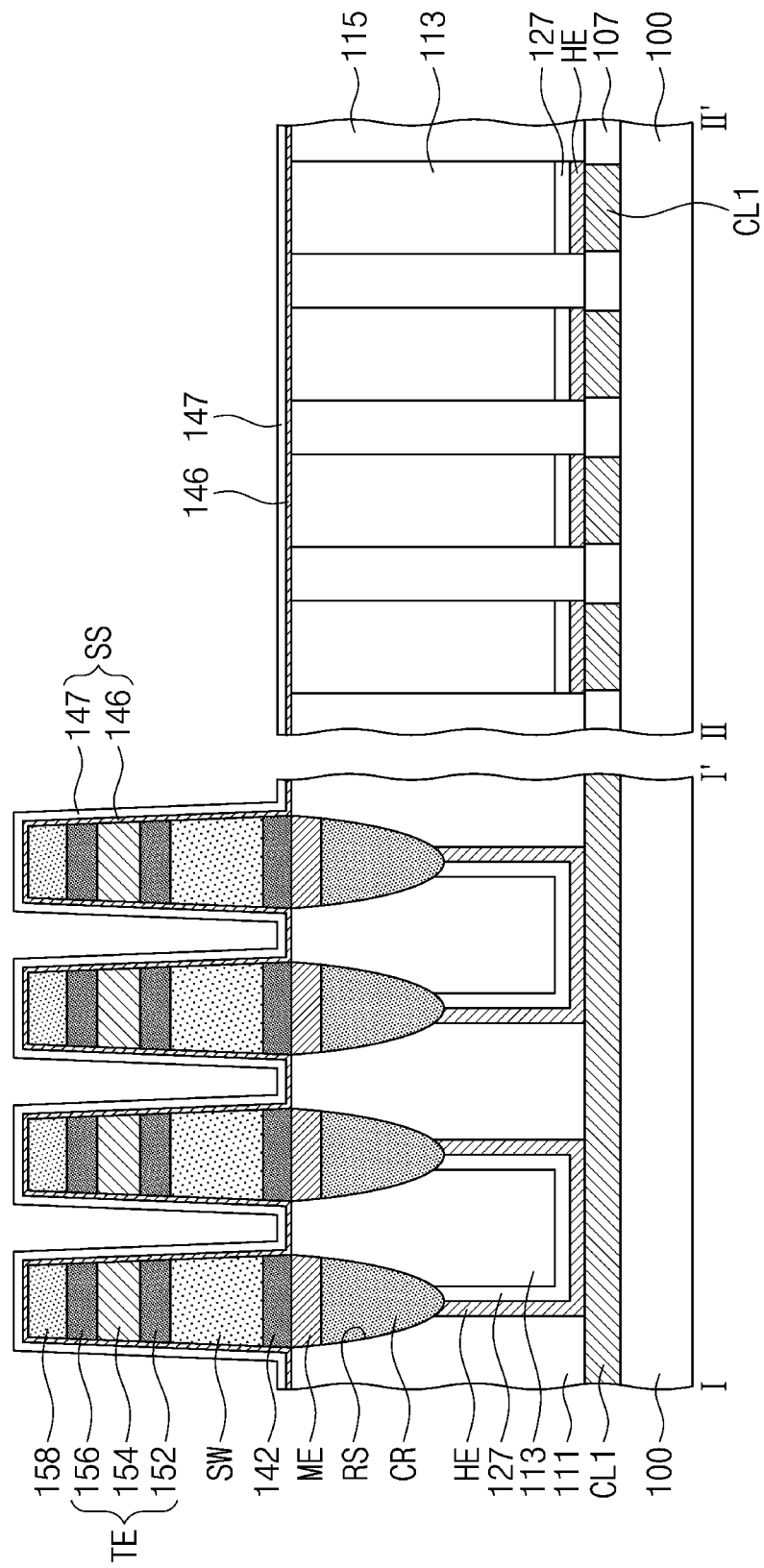

Referring to FIGS. 3 and 11, a main insulating layer 147 may be formed on the passivation layer 146. The main insulating layer 147 may be spaced apart from the switching elements SW by the passivation layer 146. The main insulating layer 147 may be conformally formed along the passivation layer 146. The main insulating layer 147 may be thicker than the passivation layer 146.

The passivation layer 146 and the main insulating layer 147 may constitute a sidewall insulating layer SS. The sidewall insulating layer SS may not include oxygen, except undesired impurities. For example, each of the passivation layer 146 and the main insulating layer 147 may include silicon nitride.

Figure 13:
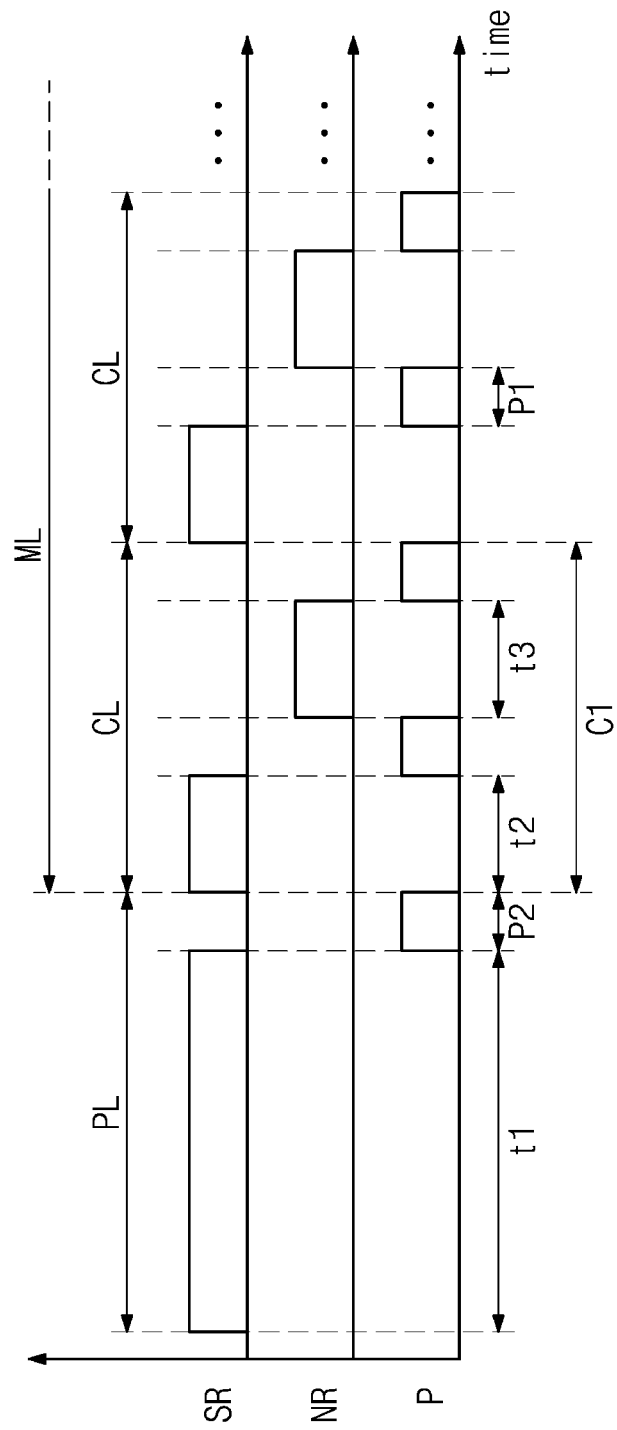
FIGS. 13 and 14 are process conceptual diagrams of a process of forming a sidewall insulating layer.
Figure 14:
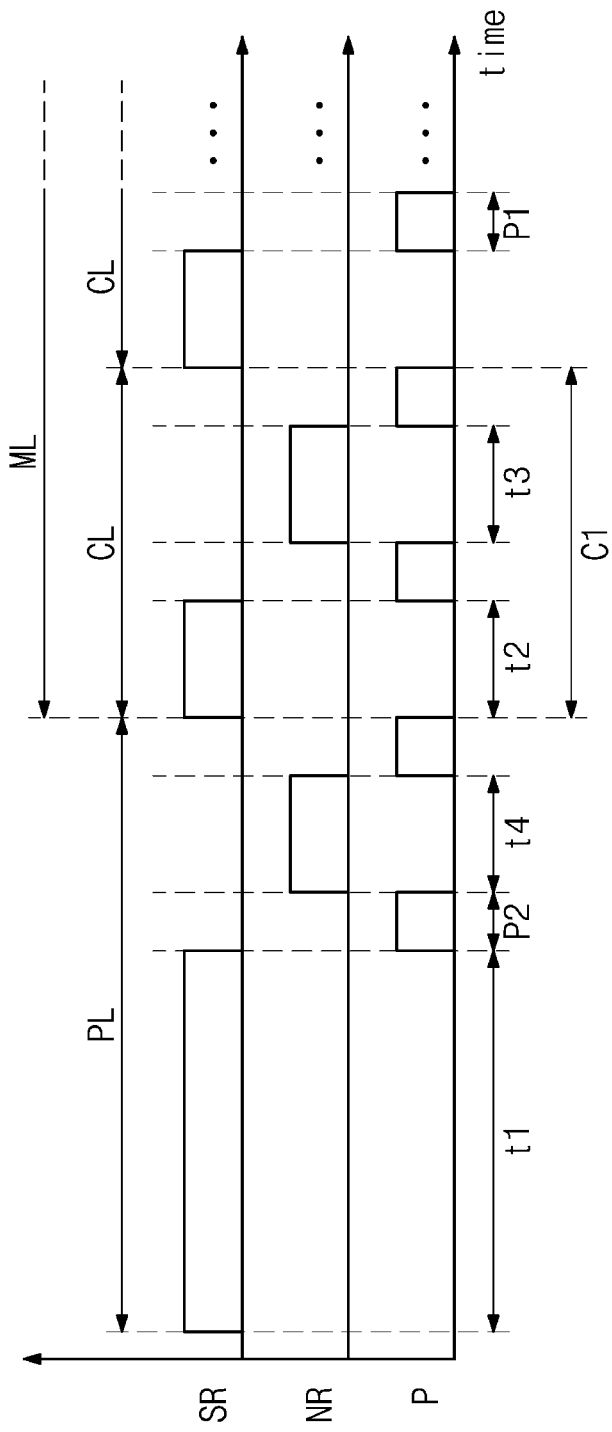

FIGS. 13 and 14 are process conceptual diagrams of a process of forming the sidewall insulating layer SS. Hereinafter, the process of forming the sidewall insulating layer SS will be described in more detail with reference to FIGS. 13 and 14.

The formation of the sidewall insulating layer SS may include a deposition process in which a process cycle including supplying a silicon source is performed a plurality of times. For example, the formation of the sidewall insulating layer SS may include a main step ML of performing a process cycle CL, which includes supplying a silicon source (SR) and supplying a reaction gas (NR), a plurality of times. For example, the formation of the sidewall insulating layer SS may include a plasma enhanced atomic layer deposition (PE-ALD) process. However, embodiments of the inventive concepts are not limited thereto.

The silicon source may include at least one of $SiI_2H_2$, di-isopropyl-amino-silane (DIPAS), $SiH_4$, $Si_2H_6$, DCS, hexachlorodisilane (HCD), tetrachlorosilane (TCS), and trisilylamine (TSA). The reaction gas may be a gas including nitrogen, such as $N_2$ and/or $NH_3$.

In the main step ML, a purging process P using an inert gas may be performed between the process cycles CL. In addition, the purging process P may be performed between the supplying of the silicon source and the supplying of the reaction gas in each of the process cycles CL. The purging process P may be performed using a purging gas including an inert gas (e.g., argon).

In the main step ML, when the supplying of the silicon source is performed on a wafer (i.e., the substrate 100) loaded in a process chamber, a material of the silicon source may be adsorbed on the upper structures US (more particularly, on exposed sidewalls of the switching elements SW). Thereafter, an unadsorbed silicon source may be purged by the purging process P. When the supplying of the reaction gas is started, a material of the reaction gas may react with the adsorbed silicon source to form a sidewall insulating layer covering the exposed sidewalls of the switching elements SW. The supplying of the reaction gas may be performed in a state where radio-frequency (RF) power for forming plasma is applied. The RF power for forming plasma may be applied after the start of the supplying of the reaction gas, and the application of the RF power may be finished with an end of the supplying of the reaction gas. The RF power for forming plasma may not be applied in the supplying of the silicon source and the purging process P. Nitrogen plasma may be formed from the reaction gas by the RF power. The nitrogen plasma may react with the silicon source adsorbed on the sidewalls of the upper structures US, thereby forming silicon nitride. For example, the main insulating layer 147 may be formed by the present main step ML.

A time duration c1 of one process cycle CL may range from about 30 seconds to about 90 seconds. In one process cycle CL, the supplying of the silicon source may be performed for a second time duration t2, and the supplying of the reaction gas may be performed for a third time duration t3. The second time duration t2 may be equal to or longer than the third time duration t3. For example, each of the second time duration t2 and the third time duration t3 may range from about 1 second to about 9 seconds. A time duration P1 of the purging process P may be longer than each of the second time duration t2 and the third time duration t3. For example, the time duration P1 for the purging process P may range from about 7 seconds to about 20 seconds. The second time durations t2 in the process cycles CL may be equal to one another, and the third time durations t3 in the process cycles CL may be equal to one another. However, embodiments of the inventive concepts are not limited thereto.

The formation of the sidewall insulating layer SS may include a preliminary step PL which includes supplying the silicon source onto the exposed sidewalls of the switching elements SW, prior to starting the main step ML. The main step ML and the preliminary step PL may be performed in-situ in the same process chamber. The supplying of the silicon source in the preliminary step PL may be performed for a first time duration t1. The first time duration t1 may be longer than the time duration c1 of one process cycle CL. The first time duration t1 may be shorter than a time duration of five process cycles CL. For example, the first time duration t1 may range from about 90 seconds to about 150 seconds. The first time t1 may range from about 10 times to about 50 times the second time duration t2.

In the preliminary step PL, the supplying of the silicon source may be performed once. The amount of the silicon source supplied in the supplying performed once in the preliminary step PL may range from about 10 times to about 50 times the amount of the silicon source supplied in the one process cycle CL. A flow rate of the supplying of the silicon source in the preliminary step PL may be substantially equal to a flow rate of the supplying of the silicon source in the main step ML. Alternatively, the flow rate of the supplying of the silicon source in the preliminary step PL may be greater than the flow rate of the supplying of the silicon source in the main step ML.

As illustrated in FIG. 13, supplying of the reaction gas may not be performed during the preliminary step PL. After the supplying of the silicon source in the preliminary step PL is completed, a purging process P may be performed. A time duration P2 of the purging process P in the preliminary step PL may be equal to the duration time duration P1 of the purging process P in the main step ML. However, embodiments of the inventive concepts are not limited thereto.

As illustrated in FIG. 14, the preliminary step PL may include supplying the reaction gas after the supplying of the silicon source. A time duration t4 of the supplying of the reaction gas in the preliminary step PL may be substantially equal to the third time duration t3 of the supplying of the reaction gas of the main step ML.

The preliminary step PL may be performed at a process pressure equal to or lower than that of the main step ML. For example, the process pressure in the preliminary step PL may range from about 50% to about 100% of the process pressure of the main step ML. The preliminary step PL may be performed at the same process temperature as the main step ML. For example, the process temperature may range from about 120 degrees Celsius to about 280 degrees Celsius.

The passivation layer 146 may be formed by the preliminary step PL. In the etching process for forming the upper structures US, a ratio of lattice defects (e.g., dangling bonds) may be increased at the sidewalls of the switching elements SW due to etch damage. The lattice defects (in particular, lattice defects of a layer including a material with high volatility) may be combined with nitrogen atoms having higher reactivity than silicon atoms or nitrogen radicals by plasma, thereby forming nitrogen compounds. The nitrogen compound may deteriorate electrical characteristics of the memory cells (in particular, the switching elements SW), and may also deteriorate dispersion of electrical characteristics in a wafer. In addition, the exposed sidewalls of the switching elements SW may be additionally damaged by the nitrogen atoms or the nitrogen radicals.

However, according to the embodiments, the passivation layer 146 may be formed on the damaged sidewalls of the switching elements SW by the preliminary step PL (more particularly, the silicon source supplied for a relatively long time). The passivation layer 146 may inhibit or prevent the memory cells from being deteriorated by the reaction gas supplied in the main step ML performed thereafter. In addition, the preliminary step PL and the main step ML may be performed in-situ, and may use the same source, and thus the processes may be simplified and characteristics and dispersion of the memory cells may be improved.

Figure 12:
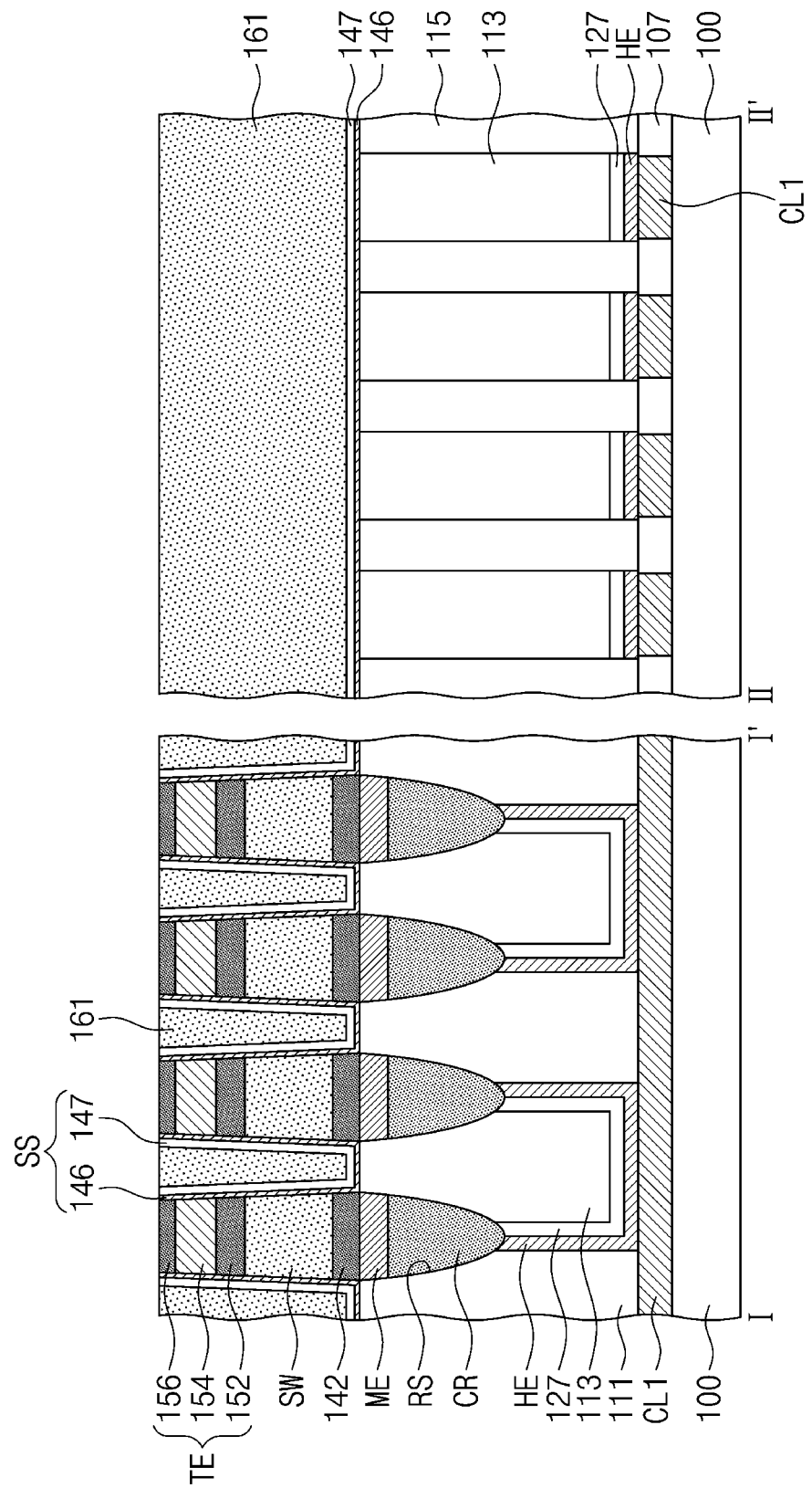

Referring to FIGS. 3 and 12, a filling insulation layer 161 may be formed between the upper structures US. The filling insulation layer 161 may be formed using an ALD process or a chemical vapor deposition (CVD) process. For example, the filling insulation layer 161 may include silicon nitride, silicon carbide, or silicon carbonitride. The process of forming the filling insulation layer 161 may be performed at a higher temperature than that of the process of forming the sidewall insulating layer SS. For example, the process of forming the filling insulation layer 161 may be performed at a temperature of about 220 degrees Celsius to about 300 degrees Celsius. A silicon source for forming the filling insulation layer 161 may be different from the silicon source for forming the sidewall insulating layer SS. In certain embodiments, the filling insulation layer 161 may be formed using a flowable CVD method.

After the formation of the filling insulation layer 161 is completed, a planarization process may be performed. The mask patterns 158 may be removed in the planarization process. In addition, a portion of the second carbon electrode pattern 156 and a portion of the sidewall insulating layer SS may also be removed.

Referring again to FIGS. 3 and 4, second conductive lines CL2 may be formed on the top electrodes TE. The formation of the second conductive lines CL2 may include forming a conductive layer on the top electrodes TE, and patterning the conductive layer. Thereafter, a fourth interlayer insulating layer 117 may be formed to fill spaces between the second conductive lines CL2. For example, the fourth interlayer insulating layer 117 may include a silicon oxide layer and/or a silicon oxynitride layer.

According to the embodiments, it is possible to prevent the memory cells from being deteriorated by a reaction gas.

Figure 15:
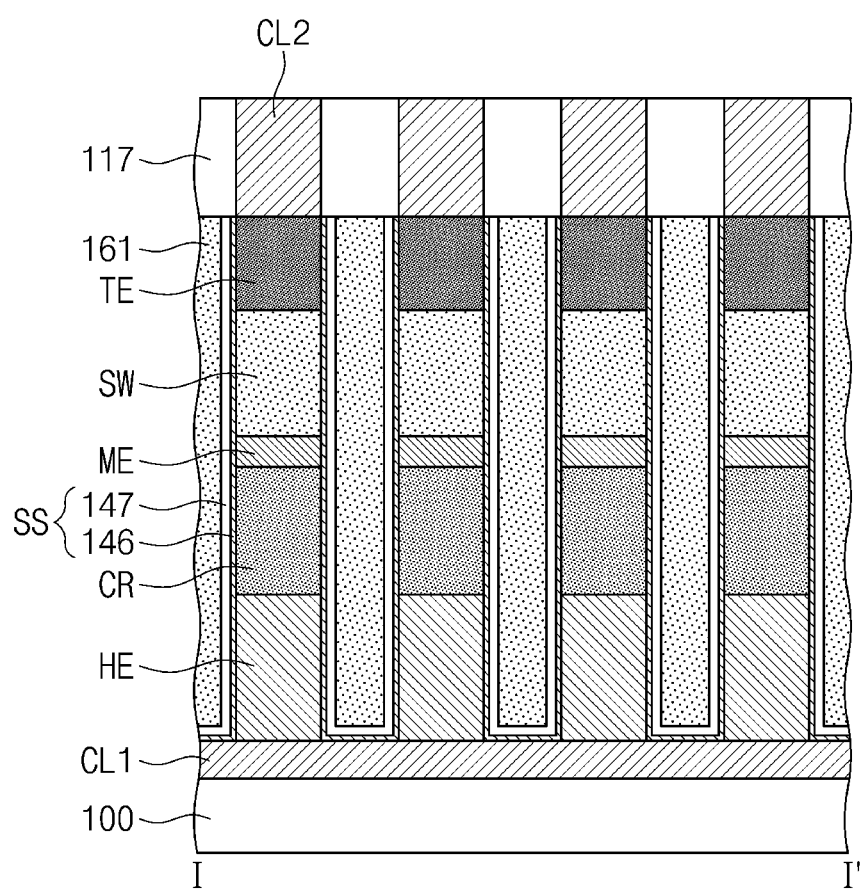
FIG. 15 is a cross-sectional view taken along the line I-I' of FIG. 3 to illustrate a variable resistance memory device according to some embodiments.

FIG. 15 is a cross-sectional view taken along the line I-I' of FIG. 3 to illustrate a variable resistance memory device according to some embodiments. Hereinafter, the descriptions to the same components as in the above embodiments will be omitted for the purpose of ease and convenience in explanation.

Referring to FIGS. 3 and 15, a sidewall insulating layer SS according to the present embodiment may extend from a sidewall of a switching element SW onto a sidewall of a variable resistance structure CR. A bottom surface of the sidewall insulating layer SS may be lower than a top surface of a heater electrode HE. Positions of the switching element SW and the variable resistance structure CR may be exchanged with each other.

According to the present embodiment, the passivation layer 146 may protect the sidewall of the switching element SW and the sidewall of the variable resistance structure CR which are damaged by an etching process, and thus, it is possible to prevent the memory cell from being deteriorated by the reaction gas supplied in the main step ML performed thereafter.

According to the embodiments, it is possible to prevent the memory cells from being deteriorated by a reaction gas. According to the embodiments, the passivation layer capable of preventing deterioration of the memory cell may be easily formed.

While the inventive concepts have been described with reference to example embodiments, it will be apparent to those skilled in the art that various changes and modifications may be made without departing from the spirits and scopes. Therefore, it should be understood that the above embodiments are not limiting, but illustrative. Thus, the scopes are to be determined by the broadest permissible interpretation of the following claims and their equivalents, and shall not be restricted or limited by the foregoing description.

What is claimed is:

1. A method of manufacturing a variable resistance memory device, the method comprising:
   forming an array of memory cells on a substrate, each of the memory cells comprising a variable resistance structure and a switching element; and
   forming a sidewall insulating layer covering a sidewall of the switching element, the forming the sidewall insulating layer comprising:
      performing a preliminary step comprising:
         supplying a silicon source to the sidewall of the switching element; and
         after the silicon source is supplied, supplying a reaction gas, a time duration of the supplying the silicon source in the preliminary step being longer than a time duration of the supplying the reaction gas in the preliminary step; and
      after the preliminary step is performed, performing a main step comprising performing a process cycle a plurality of times, the process cycle comprising:
         supplying the silicon source; and
         after the silicon source is supplied, supplying the reaction gas, the time duration of the supplying the silicon source in the preliminary step being longer than a time duration of the supplying the silicon source in the process cycle in the main step.

2. The method of claim 1, wherein the time duration of the supplying the silicon source in the preliminary step is shorter than a time duration of performing the process cycle five times in the main step.

3. The method of claim 1, wherein the time duration of the supplying the silicon source in the preliminary step is about 10 times longer than the time duration of the supplying the silicon source in the process cycle in the main step.

4. The method of claim 1, wherein the silicon source is supplied only once during the preliminary step.

5. The method of claim 1, wherein the reaction gas is supplied only once during the preliminary step.

6. The method of claim 1, wherein the preliminary step and the main step are performed in-situ.

7. The method of claim 1, wherein the performing the preliminary step further comprises purging at least a part of the silicon source that is unadsorbed on the sidewall of the switching element, prior to starting the main step.

8. The method of claim 1, wherein the preliminary step is performed at a lower pressure than the main step.

9. The method of claim 1, wherein the reaction gas comprises nitrogen atoms.

10. The method of claim 1, wherein radio-frequency (RF) power is applied during the supplying the reaction gas in the preliminary step and the main step.

11. The method of claim 1, wherein the sidewall insulating layer comprises two different silicon-containing layers different from a filling insulation layer.

12. A method of manufacturing a variable resistance memory device, the method comprising:
   forming an array of memory cells on a substrate, wherein each of the memory cells comprises a variable resistance structure and a switching element; and
   forming a sidewall insulating layer covering a sidewall of the switching element, wherein the forming the sidewall insulating layer comprises performing a deposition process in which a process cycle comprising supplying a silicon source is performed a plurality of times, wherein a time duration of the supplying the silicon source in an initial process cycle is longer than a time duration of the supplying the silicon source in a subsequent process cycle, when the process cycle is performed the plurality of times, and wherein the supplying the silicon source in the initial process cycle is performed at a lower pressure than the supplying the silicon source in the subsequent process cycle.

13. The method of claim 12, wherein a process cycle performed after the initial process cycle comprises supplying a reaction gas.

14. The method of claim 12, wherein the time duration of the supplying the silicon source in the initial process cycle is longer than a time duration of the subsequent process cycle.

15. The method of claim 13, wherein radio-frequency (RF) power is applied t-during the supplying the reaction gas, and the RF power is not applied during the supplying the silicon source.

16. The method of claim 12, further comprising forming a filling insulation layer filling a space between the memory cells, after the forming the sidewall insulating layer,
   wherein the sidewall insulating layer is formed at a lower temperature than the filling insulation layer.

17. The method of claim 16, wherein the sidewall insulating layer is formed at a temperature about 120 degrees Celsius to about 280 degrees Celsius and the filling insulation layer is formed at a temperature about 220 degrees Celsius to about 300 degrees Celsius.

\* \* \* \* \*